United States Patent [19]
Arai

[11] Patent Number: 5,770,872
[45] Date of Patent: Jun. 23, 1998

[54] PHOTOELECTRIC CONVERTER APPARATUS

[76] Inventor: Chihiro Arai, c/o Sony Corporation 7-35, Kitashinagawa 6-Chome, Shinagawa-ku, Tokyo, Japan

[21] Appl. No.: 759,427

[22] Filed: Dec. 5, 1996

[30] Foreign Application Priority Data

Dec. 6, 1995 [JP] Japan ................................. 7-344977

[51] Int. Cl.$^6$ ..................... H01L 29/80; H01L 31/0288; H01L 31/112
[52] U.S. Cl. ......................... 257/257; 257/187; 257/461; 257/462; 257/463
[58] Field of Search .................................. 257/187, 444, 257/461, 462, 463, 257, 258

[56] References Cited

U.S. PATENT DOCUMENTS

| | | |
|---|---|---|
| 5,245,203 | 9/1993 | Morishita et al. ...................... 257/113 |
| 5,252,851 | 10/1993 | Mita et al. ............................... 257/446 |
| 5,382,824 | 1/1995 | Popovic ................................... 257/464 |
| 5,418,396 | 5/1995 | Mita ........................................ 257/461 |
| 5,500,550 | 3/1996 | Morishita ............................... 257/461 |

Primary Examiner—Mahshid D. Saadat
Assistant Examiner—Allan R. Wilson
Attorney, Agent, or Firm—Hill & Simpson

[57] ABSTRACT

In a light receiving element and a semiconductor device manufacturing method, the low density PN junction is formed by constructing the internal composition of the photodiode with $N^+$ type diffusion layer, $N^-$ type epitaxial layer, $P^-$ type epitaxial layer, $P^+$ type deposit layer, and P type Si from the light receiving surface, the vacant layer to be occurred when the photodiode is reverse biased will be widened and the light receiving sensitivity and the frequency characteristic will be improved. Furthermore, since the separation of bipolar elements will be conducted by $P^-$ epitaxial layer, the efficiency in density control at the time of $P^-$ type epitaxial growth can be improved.

9 Claims, 6 Drawing Sheets

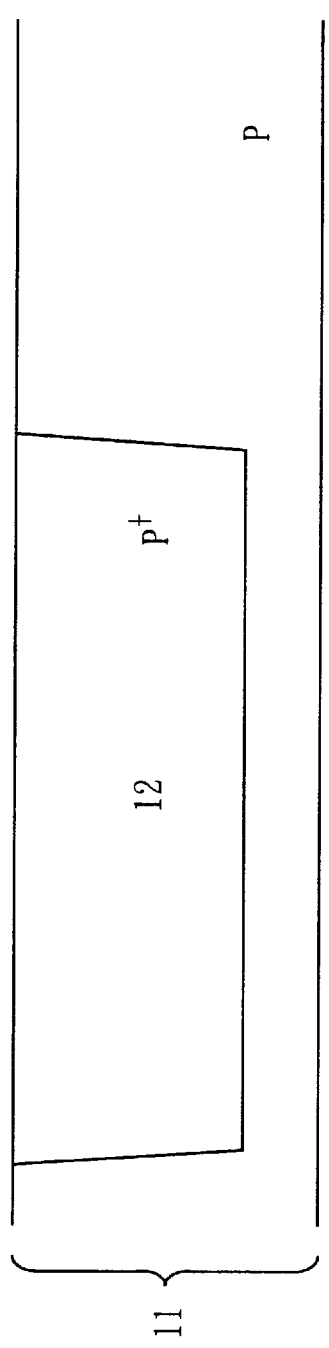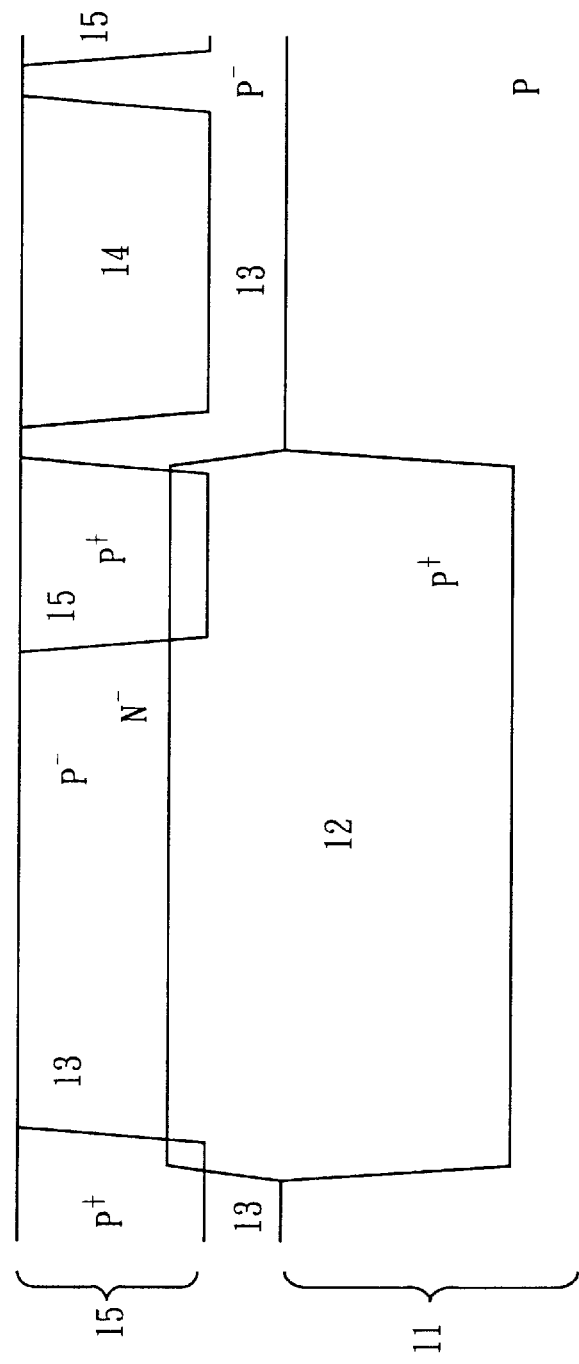
FIG. 4A
FIG. 4B

PHOTOELECTRIC CONVERTER APPARATUS

BACKGROUND OF THE INVENTION

1. Field of the Invention

This invention relates to the construction of a light receiving element and a manufacturing method of the semiconductor device including the light receiving elements.

2. Description of the Related Art

FIG. 1 shows the construction of a related art of a photodiode and a bipolar transistor which are light receiving elements and formed on the same substrate. In FIG. 1, the left area shows an example of the construction of the photodiode, and the right area shows an example of the construction of the bipolar transistor. An N type deposit layer 14 and a P type deposit layer P+ 15 are formed on an n type semiconductor substrate 11, respectively. Then a P type semiconductor element isolation region 17 is formed by growing an N type epitaxial layer 16.

A base region 18 of a P type semiconductor is formed at the right area on the epitaxial layer 16 and an N+ type diffusion layer 19 are formed in the left area and emitter and collector regions in the right area.

Nextly, an electrode layer of photodiode 22 and electrode layers of a base, an emitter and a collector of bipolar transistor 22 are formed in pattern. Then an insulation film is formed thereon. The thickness of the N− type epitaxial layer 16 is determined by the characteristic of bipolar element, and generally in the bipolar IC having approximately 10 [V] resisting power, the film thickness of 3–4 [$\mu$m] was necessary.

According to the construction described above, the light receiving sensitivity of the photodiode is determined by the number of carriers generated in a vacant layer 100 and the number of carriers reached to the vacant layer 100 by diffusion out of carriers generated in the area interior to the vacant layer. Accordingly, in order to improve the light receiving sensitivity it was necessary to widen the vacant layer 100 and to increase the number of carriers to be brought in the vacant layer by providing semiconductor layer having long diffusion length at the upper and lower parts of the vacant layer 100. These two processes, to enlarge the width of vacant layer 100 and to provide the semiconductor layer having long diffusion length lead to control the impurity concentration.

On the other hand, the frequency characteristic of the photodiode is determined by the parasitic capacitance and parasitic resistance of the diode. Accordingly, in order to improve the frequency characteristic, it is necessary to decrease the parasitic capacitance and the parasitic resistance. In order to decrease the parasitic capacitance it is effective to enlarge the vacant layer 1000 and this means the decreasing of the impurity concentration of the junction. Furthermore, to decrease the parasitic resistance means to increase the impurity concentration of the semiconductor layer except the vacant layer. For example, referring to FIG. 1, the P type deposit layer 15 is provided to decrease the parasitic resistance of anode. Since the P type deposit layer 15 has high impurity concentration, the lengths of diffusion of a small number of carriers are short and the carriers which contribute to the light receiving sensitivity of the photodiode are almost all carriers generated at the upper part of this P type deposit layer 15.

These photodiodes are widely used to read out information recorded on such as the compact disc (CD) and mini disc (MD). However, the wavelength of the semiconductor laser used in this type of optical disc is 780 [nm] and since the absorption length in Si of the laser with 780 [nm] wavelength is 9 [$\mu$m], it created a problem that sufficient light receiving sensitivity could not be obtained due to the existence of P type deposit layer 15 positioned at 3–4 [$\mu$m] from the surface in the conventional composition shown in FIG. 1.

SUMMARY OF THE INVENTION

In view of the foregoing, the first object of this invention is to improve the light receiving sensitivity of photodiodes.

The second object is to improve the frequency characteristics of photodiodes.

The third object is to achieve said first and second objects and provide a method of manufacturing a semiconductor device which is capable of easily isolating photodiodes from bipolar elements.

The foregoing objects and other objects of the present invention have been achieved by the provision of a light receiving element in which the impurity density of the first and second conductive types in the parts to be vacated when impressing the reverse voltage are both kept less than 1E16 [$cm^{-3}$]. Thus, since in the case of impressing the reverse voltage to the light receiving elements, the impurity densities of the first and second conductive types vacancies to be formed can be kept both less than 1E16 [$cm^{-3}$], the vacant layer can be sufficiently enlarged, and both the improvement in the light receiving sensitivity and the decrease of parasitic capacitance can be achieved. Thus, the construction of light receiving element having fairly good frequency characteristics can be obtained.

The nature, principle and utility of the invention will become more apparent from the following detailed description when read in conjunction with the accompanying in which like parts are designated by like reference numerals or characters.

BRIEF DESCRIPTION OF THE DRAWINGS

In the accompanying drawings:

FIGS. 4A–4C are brief sectional views showing the process of semiconductor manufacturing process according to third and fourth embodiments of this invention.

DETAILED DESCRIPTION OF THE EMBODIMENT

Preferred embodiment of this invention will be described with reference to the accompanying drawings. First, the basic construction will be described.

Figure 2:
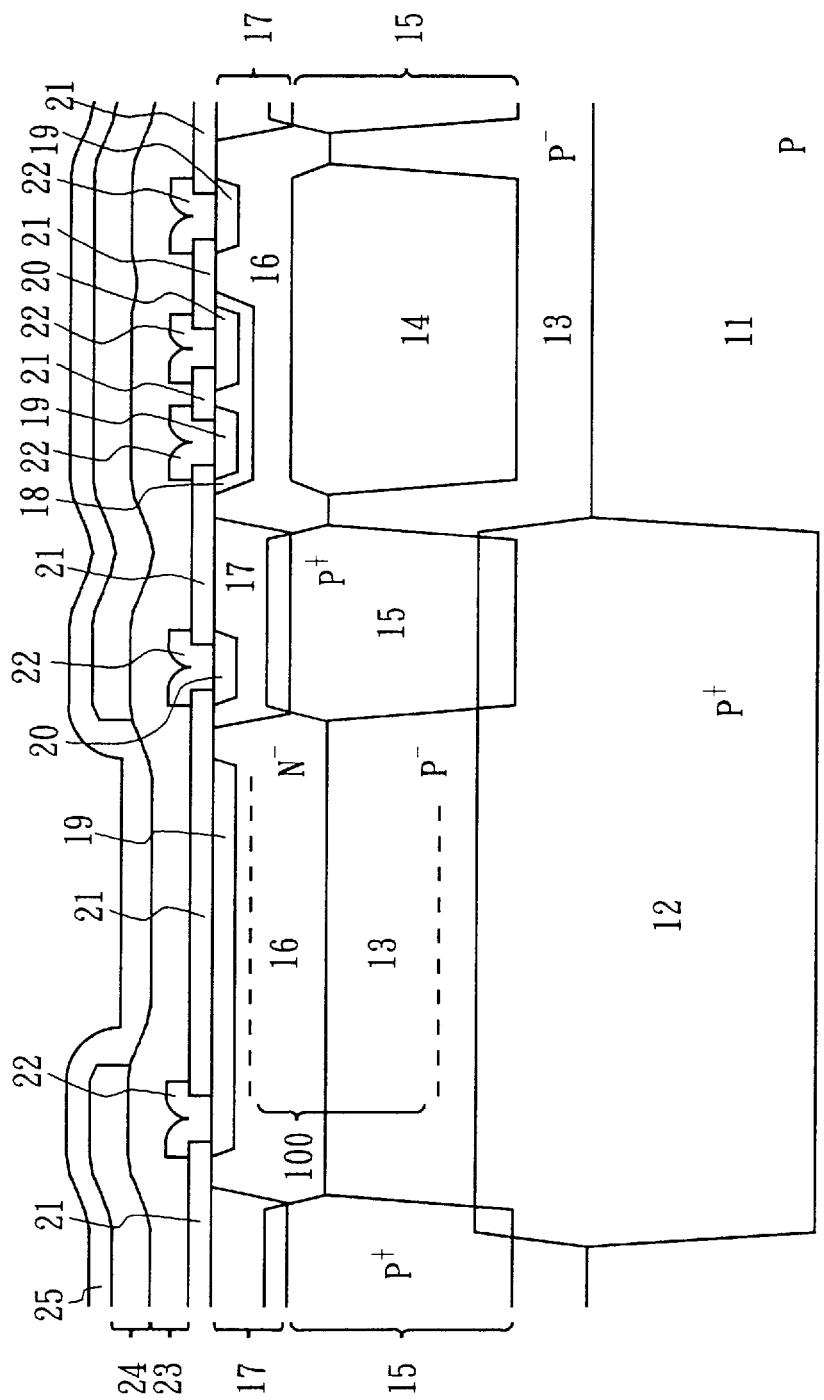
FIG. 2 is a brief sectional view showing the sectional construction of a light receiving element according to a first embodiment of this invention.

A brief cross sectional construction of a photodiode PD according to a first embodiment of this invention will be shown in FIG. 2.

As shown in FIG. 2, P type deposit layer 12 to be formed on the P type semiconductor substrate 11 is formed selectively in the lower part of the photodiode PD. P⁻ type epiaxial layer 13 having an ultra low density is piled on the upper layer and furthermore, over that upper layer the N⁻ type epitaxial layer 16 is to be piled.

On the other hand, in the bipolar element part, P type deposit layer 15 and N type deposit layer 14 are formed between the P⁻ type epitaxial layer 12 and the N⁻ type epitaxial layer 16. And N⁺ type diffusion layer 19 is provided on the cathode surface of the photodiode part.

Since the photodiode PD is constructed as described above, it becomes possible to form the PN junction in the part near the surface like the boundary surface between the P⁻ type epitaxial layer 12 and the N⁻ type epitaxial layer 16. This means that the vacant layer 100 can be formed on the surface where the quantity of penetrating light is large.

Moreover, in the case of photodiode PD according to this embodiment, the P⁻ type epitaxial layer 12 is formed in ultra low density in order to increase the light receiving sensitivity of the photodiode PD, and normally the N⁻ type epitaxial layer 16 is set to less than 1E16 [cm⁻³] density as the density to optimize the bipolar characteristic.

Accordingly, the vacant layer spreading centering around the PN junction can be sufficiently extended toward both the P type semiconductor layer side and the N type semiconductor layer side. Moreover, since in the case of impressing the reverse voltage, the N⁻ type epitaxial layer 16 and the P⁻ type epitaxial layer are deposited in the part where the vacant layer 100 is to be extended and the P type deposit layer 12 and the N type diffusion layer 19 are provided in the part where the vacant layer 100 would not reach, the width of the vacant layer 100 can be sufficiently extended and as a result, the parasitic capacitance can be decreased.

Figure 1:
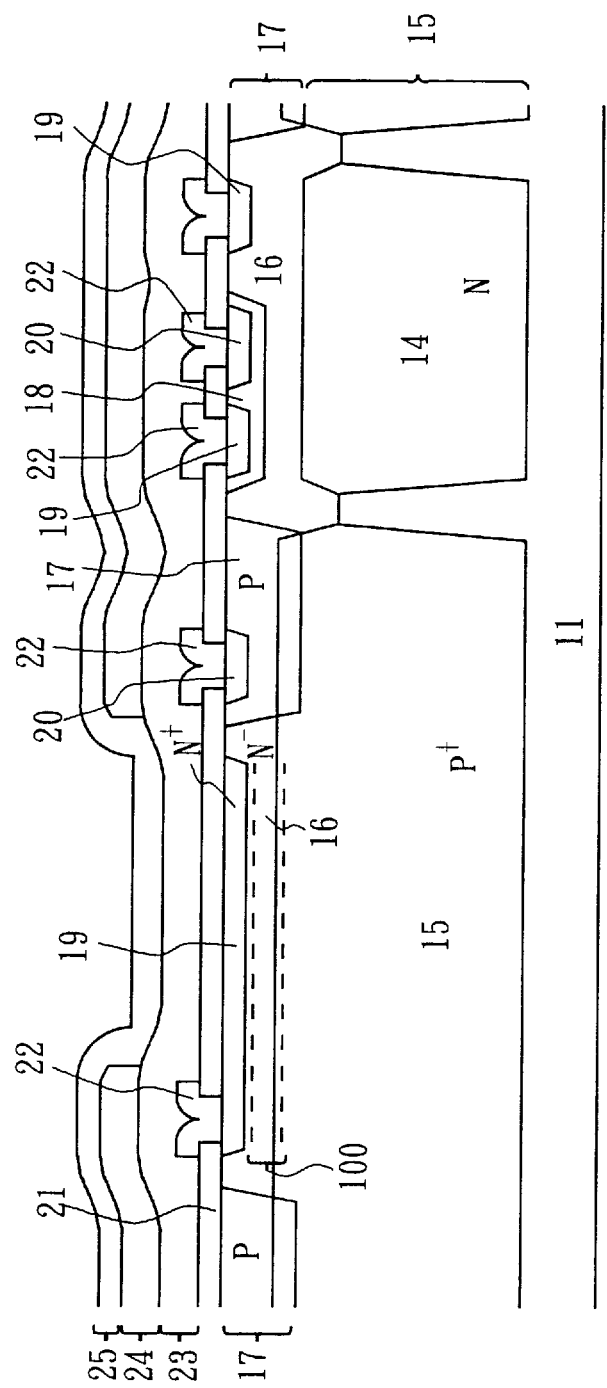
FIG. 1 is a brief sectional view of a photodiode and a bipolar transistor of the related art.

Furthermore, regarding the separation of bipolar elements, since the P⁻ type epitaxial layer is placed under the P type deposit layer 15, the P type deposit layers 15 can be connected via this epitaxial layer, and the P type deposit layer 12 for connecting the P type silicon substrate 11 and the P type deposit layer 15 as the construction shown in FIG. 1 becomes unnecessary. The advantage of placing the P⁻ type epitaxial layer under the P type deposit layer 15 also exists on the photodetector PD side. Since it becomes unnecessary to connect the P type silicon substrate 11 and the P type deposit layer 15 by the P type deposit layer 12, the restriction imposed on the thickness of P type deposit layer 12 can be removed.

Figure 3:
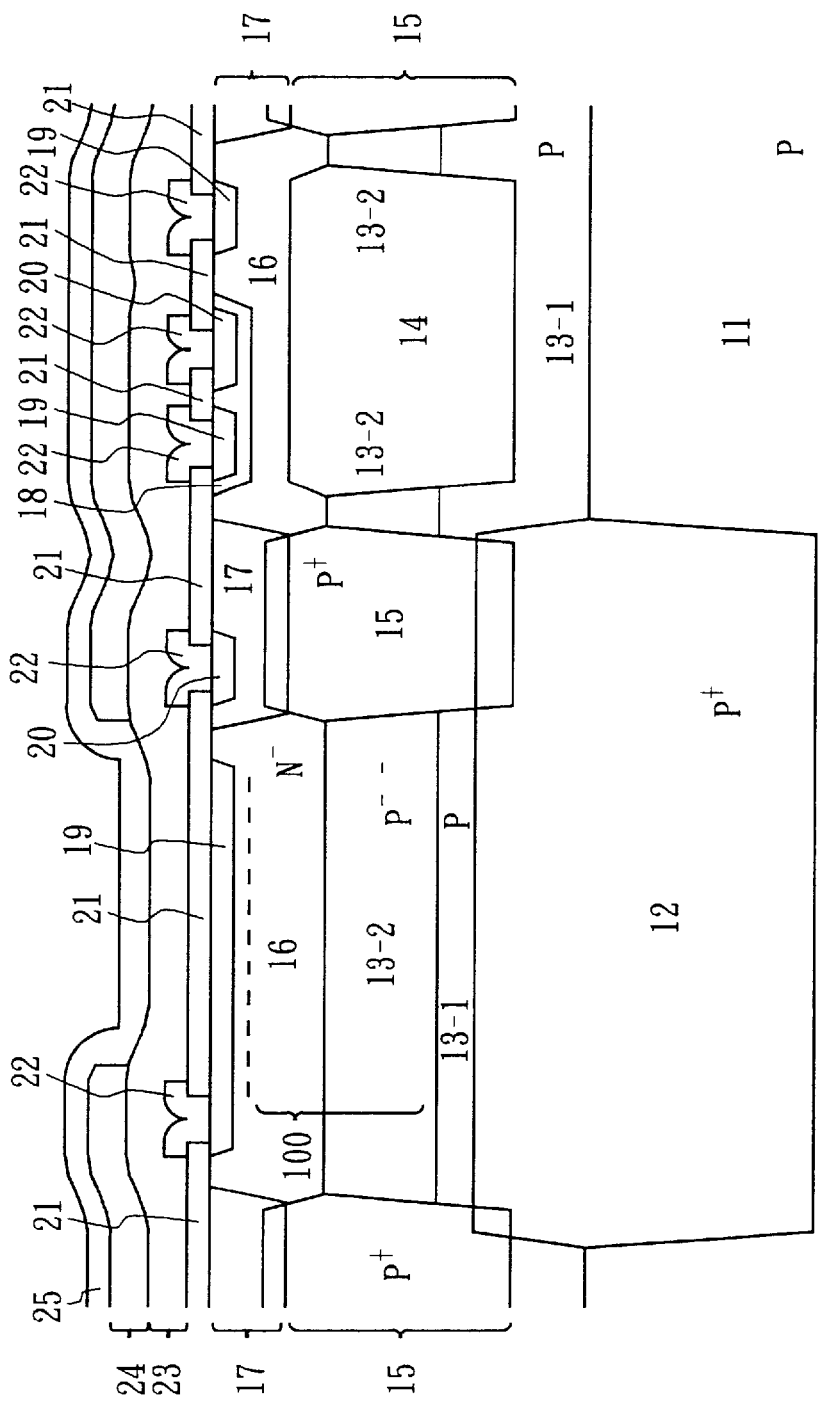
FIG. 3 is a brief sectional view showing the sectional construction of a light receiving element according to second and fifth embodiments of this invention.
Figure 4C:
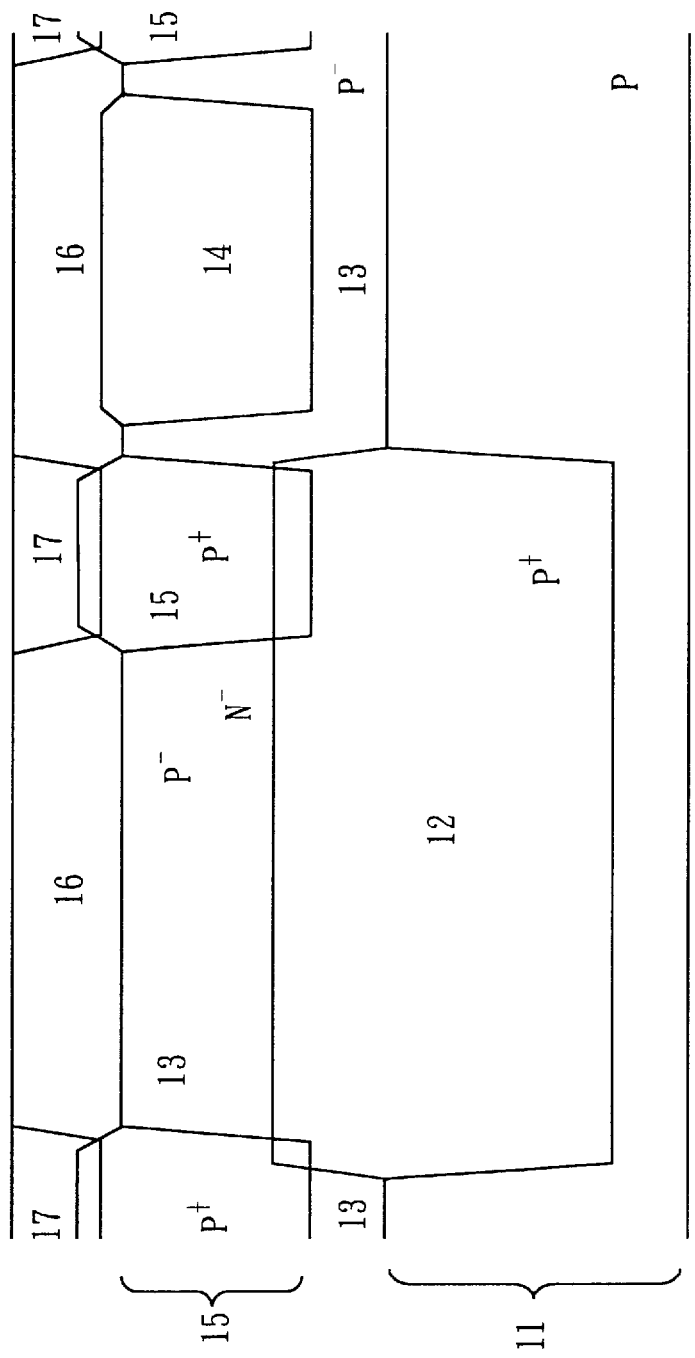

Then, FIG. 3 shows a brief sectional view of the photodiode PD according to a second embodiment of this invention.

As shown in FIG. 3, this photodiode PD comprises the P type epitaxial layer 13 consisting of P type epitaxial layer 13-1 having almost equal concentration to the P type silicon substrate 11 and P type epitaxial layer 13-2 with ultra low concentration, and the P type epitaxial 13-1 is in contact with the P⁺ type deposit layer 15.

Moreover, in the case of impressing the reverse voltage, the vacant layer 100 completely vacates the P⁻ type epitaxial layer 13-2.

In the P⁻ type epitaxial layer 13 which works as isolation of the bipolar element, its latch up resistivity can be increased the higher the density is. Accordingly, to increase the density of the part not to be vacated in the P type epitaxial layer 13-1 as compared with the part to be vacated in the P⁻ type epiaxial layer 13-2 contributes to decreasing the parasitic resistance caused by the unvacated P⁻ type epitaxial layer 13-1 and makes the improvement of the latch up resistivity possible as well as maintaining the feature of low parasitic capacitance which is the feature of this invention shown in FIG. 2.

In summing up, since the impurity densities of the parts to be vacated in case of adding the reverse voltage to the photodiode are set to less than 1E16 [cm⁻³] both on the P type side and the N type side, the vacant layer 100 can be enlarged sufficiently and photo receiving sensitivity can be improved and further the frequency characteristic can be improved by decreasing the parasitic capacitance.

Furthermore, at this point, since the part containing higher density than the part vacated is provided in the parts other than the part to be vacated at the time when the reverse voltage is impressed on the photodiode PD, the decrease of the parasitic capacitance can be achieved.

Furthermore, since it becomes unnecessary to connect the P type deposit layer 12 for the bipolar element separation and the P type deposit layer 15 like the structure shown in FIG. 1 and since the P type deposit layer 12 in the lower part of the bipolar element becomes unnecessary, it becomes sufficient to have a small opening area of the P type deposit layer 12 and the density of the P⁻ type epitaxial layer 13 can be controlled easily at the time when depositing the ultra low density P⁻ type epitaxial layer 13.

Nextly, an element forming method according to a third embodiment of this invention shown in FIG. 2 will be described.

The manufacturing process of the photodiode PD described in the preceding chapter will be explained in the following chapter referring to FIGS. 3 and FIGS. 4A–4C.

As shown in FIG. 4A, firstly, the P type silicon substrate 11 is thermal oxidized and an oxidized film with the thickness of approximately 120 [nm] is formed on its surface. Then, making the photoresist as a mask the boron is ion implanted at the temperature of 30 [keV] to the photodiode unit selectively under the condition of 2.4E15 [cm⁻²].

Then, in order to passivate the ion implanted boron, the passivation annealing will be conducted for 80 minutes in the atmosphere of $N_2$ of 1200 [°C.].

Furthermore, in order to remove the drawback caused by the damage when implanting the ion, by oxidizing in the atmosphere of wet $O_2$ for 20 minutes at 1200 [°C.] P type deposit layer 12 is formed. Then by removing the oxide layer by using hydrofluorite acid, the construction of FIG. 4A will be obtained.

Then, the P⁻ type epitaxial layer 13 is deposited under the condition of 15 [μm] and 20 [Ω.cm]. Then after attaching 100 [nm] oxide film by the thermal oxide film, the N type deposit layer 14 will be formed by ion implanting the phosphorus at 50 [keV] under the condition of 8E14 [cm⁻²] selectively to the bipolar element part making the photodiode PD as a mask. Then, the P type deposit layer 15 will be formed by ion implanting the boron at 30 [keV] under the condition of 2.5E15 [cm⁻²] making the photodiode PF as a mask.

Furthermore, in order to passivate the ion implanted ion, a passivation annealing will be conducted for 80 minutes in the atmosphere of 120 [°C.] $N_2$. Then in order to remove the drawback due to the damage occurred when implanting the ion, oxidation will be conducted for 20 minutes in the atmosphere of 120 [° C.] wet $O_2$. Then, the construction of FIG. 4B will be obtained by removing the oxide film using hydrofluorite acid.

Then, the N⁻ type epitaxial layer 16 will be piled under the condition of 4 [μm], 1 [Ω.cm].

Moreover, after adding a 10 [nm] oxide film by the thermal oxidation, boron is ion implanted at 50 [keV] under the condition of 5E15 [$cm^{-2}$] to the isolation unit of bipolar element and the anode pull out unit of the photodiode PD making the photodiode PD as the mask, the P type isolation layer 17 will be formed. At this point, by conducting the passivation annealing in the atmosphere of $N_2$ for 80 minutes at 110 [°C.], the P type isolation layer 17 will be connected to the P type deposit layer 15 and the isolation process of the bipolar element will be conducted. As a result, the construction of FIG. 4C will be obtained.

Then, in order to form a P type base 18 on the NPN transistor part, boron is 1E14 [$cm^{-2}$] ion implanted at 30 [keV] and the passivation annealing is conducted for 30 minutes in the atmosphere of 900 [°C.] $N_2$. Then, $BF_2$ is 1E15 [$cm^{-2}$] ion implanted at 50 [keV] in order to form P type diffusion layer 20 forming the contact part with the metal panel of the base of NPN transistor and the contact part with the metal panel of the anode of the photodiode PD. Moreover, arsenic is 5E15 [$cm^{-2}$] ion implanted at 50 [keV] and the passivation annealing is conducted for 20 minutes in the atmosphere of $N_2$ in order to form N type diffusion layer 19 at the contact part of an emitter and collector of the NPN transistor and the metal panel, and on the cathode surface of the photodiode.

Then, 600 [nm] silicon oxide film is deposited as a film between the first layer AL metal panel and Si layer using the CVD method, and a contact hole will be opened using the RIE (reactive ion etching) in order to get the ohmic contact among the first layer AL panel and the bipolar element and the photodiode PD. Then, Ti and TiON, i.e., metals with high melting point, are deposited with the film thickness of approximately 30 [nm] and 70 [nm] respectively by the sputtering method. Moreover, 600 [nm] of Al containing 1 [%] of Si having low melting point is deposited by the sputtering method. Then, unnecessary part of the metal panel 22 is removed by the RIE etching method.

Then, 1 [$\mu m$] silicon oxide film will be deposited by the plasma CVD (chemical vapor deposition) method as a film 23 between the first layer AL panel 21 and the second layer AL panel 24 and the then the leveling process with the SOG (spin-on-glass) is conducted, and then the silicon oxide film will be deposited by the plasma CVD method. Then, the contact hole to connect the first layer AL panel and the second layer AL panel is opened by the RIE method, and 100 [nm] and 1000 [nm] of Ti and AlSi (1 percent) are piled respectively by the sputtering method.

Then, these metal layers only in the photodiode unit are removed selectively by the RIE etching method. And 700 [nm] of siliconnitride film is piled as an over passivation film 25 by the plasma CVD method and the siliconnitride of the bonding pad part is removed by the RIE etching method. Then, the thermal processing for sintering is conducted at 400 [°C.] for 30 minutes in the atmosphere Fo gas, and as a result, the construction shown in FIG. 2 can be obtained.

Furthermore, a manufacturing method according to a fourth embodiment of this invention shown in FIG. 3 may be conducted by continuously piling the condition of said $P^-$ epitaxial layer 13 under the conditions of 5 [$\mu m$], 4 [$\Omega.cm$] and 10 [$\mu m$], 20 [$\Omega.cm$].

An application example according to a fifth embodiment of this invention will be described.

Figure 5:
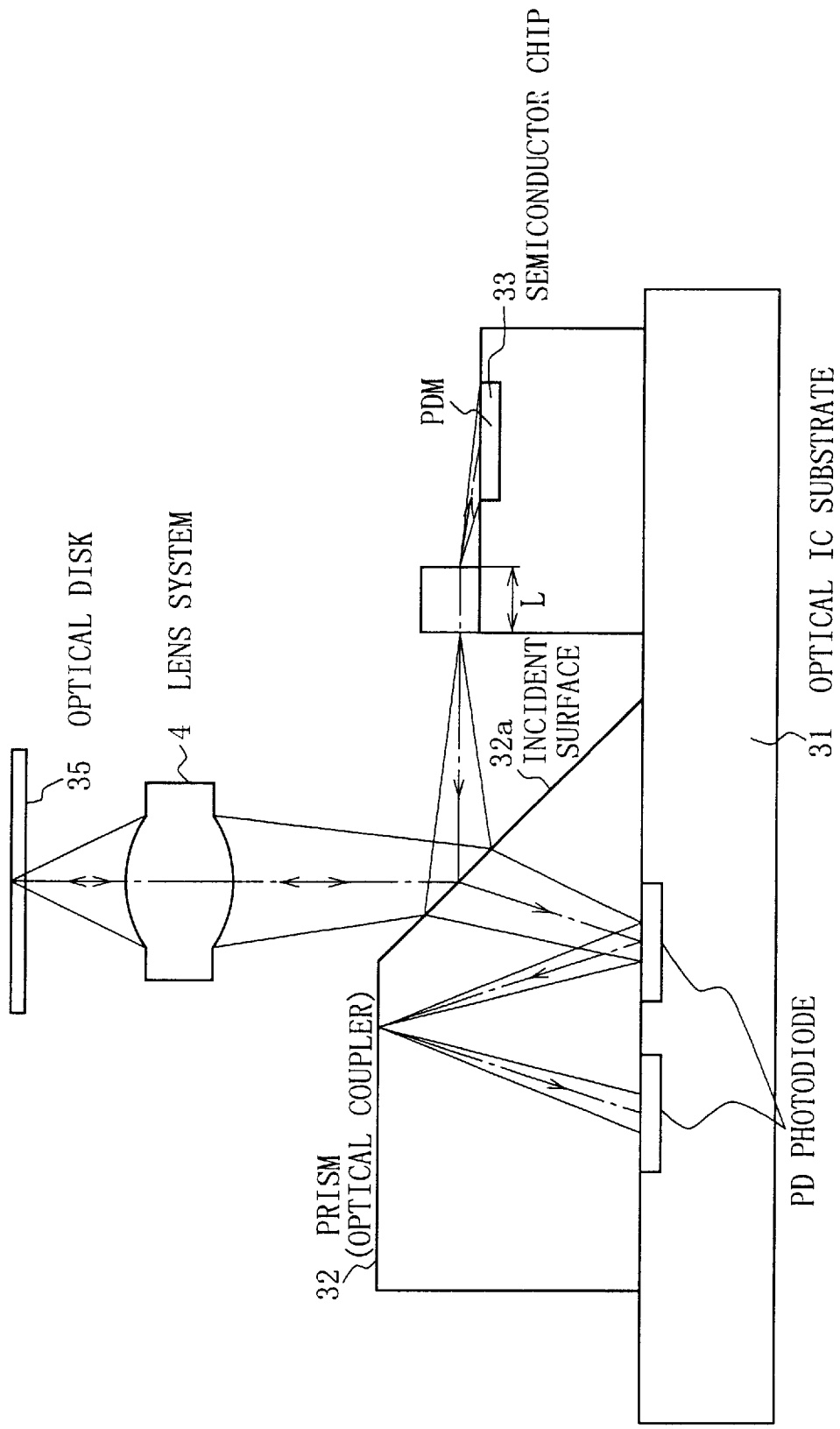
FIG. 5 is a brief diagram showing the construction of an optical pickup according to fifth and sixth embodiments of this invention.

The construction of an optical pickup as an application example of the device using the photodetector PD will be shown in FIG. 5. This optical pickup is formed by mounting a prism 32 comprising optical coupler on the optical IC substrate 31. The photodiode PD having the construction as described above is deposited on the optical IC substrate 31, and the optical coupler and the photodiode PD are kept on the positions having the fixed position relation.

Moreover, at the one end of the optical IC substrate 31, semiconductor chip 33 equipped with semiconductor laser LD is to be mounted in addition to a prism 32. In this semiconductor chip 33 photodiode $PD_M$ for detecting the light emitted backward from the semiconductor laser LD and controlling the power of semiconductor laser LD (e.g., for power monitor with PIN construction) is formed. The above is the construction of an optical pickup.

According to the foregoing construction, an outline of the optical detection operation of the optical pickup will be described below. Firstly, after the light generated from the conductor laser diode ID is reflected, condensed on an optical disc 35 in which bit information is stored via a lens system 34. This light is modulated corresponding to the information recorded on the optical disc 35 and reflected, and then fed into the prism 32 from the incident surface 32A of the prism 32.

Then the ray inputted will be reflected in the prism 32 and condensed on multiple photodiodes PD placed under the prism.

Since all photodiodes PD constructed according to the foregoing construction have high photo-receiving sensitivity and the degradation of frequency characteristic is small, information on the optical disc 35 can be read out completely even in the case where it is difficult to lead the sufficient quantity of light on the photodiode PD due to the complicated optical system being utilized in these days.

Furthermore, as the photo receiving result of multiple photodiodes PD, the read out of recording information, tracking servo, and focus servo can be executed.

Nextly, a sixth embodiment of this invention will be described.

In the embodiment described above, an optical pickup is used as a practically applied device. However, this invention is not only limited to this but also can be applied to various devices having the photodetector built-in as the photo receiving element.

Furthermore, in the embodiments described above, it is limited to the P type deposit layer 12 to deposit under the photodiode PD. However, this invention is not only limited to this but also it may be deposited under the bipolar transistor element. With this arrangement, the patterning process for depositing the P type deposit layer 12 under the photodiode PD can be omitted.

Furthermore, regarding the condition of ion implantation and the annealing condition, this invention is not only limited to the embodiments described above but the other values can be adopted according to the processing condition required.

According to this invention as described above, since the photo receiving element is to be constructed making the impurity densities of the first and second conductive type in the vacant part to be formed in case of impressing the reverse voltage both less than 1E16 [$cm^{-3}$], the vacant layer of the photo receiving element can be sufficiently enlarged and an improvement of photo receiving sensitivity as well as the decrease of parasitic capacitance can be realized. Thus, the photo receiving element having an excellent frequency characteristic can be formed.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A photoelectric converter apparatus having a bipolar element side and a photodiode side, comprising:

a semiconductor substrate of a first conductive type;

a first semiconductor layer of the first conductive type formed over a portion of said semiconductor substrate, said first semiconductor layer used in said photodiode side only;

a second semiconductor layer of the first conductive type formed over both said first semiconductor layer and said semiconductor substrate;

a third semiconductor layer of a second conductive type formed over a portion of said second semiconductor layer on said bipolar element side;

a fourth semiconductor layer of the second conductive type formed over both said second semiconductor layer and said third semiconductor layer; and an electrode formed on said fourth semiconductor layer.

2. The photoelectric converter apparatus as claimed in claim 1, wherein an impurity concentration of said second semiconductor layer is less than an impurity concentration of said first semiconductor layer.

3. The photoelectric converter apparatus as claimed in claim 1, wherein an impurity concentration of said fourth semiconductor layer is less than an impurity concentration of said third semiconductor layer.

4. The photoelectric converter apparatus as claimed in claim 1, further comprising:

a fifth semiconductor layer formed between said second semiconductor layer and said third semiconductor layer.

5. The photoelectric converter apparatus as claimed in claim 4, wherein said fifth semiconductor layer is of the first conductive type.

6. The photoelectric converter apparatus as claimed in claim 5, wherein an impurity concentration of said fifth semiconductor layer is greater than the impurity concentration of said second semiconductor layer.

7. The photoelectric converter apparatus as claimed in claim 1, wherein a vacancy layer is formed from said second and third semiconductor layers in an upper region of said first semiconductor layer, and wherein the impurity concentrations of said second and third semiconductor layers are both less than 1E16 $[cm^{-3}]$ in vacancies to be formed in the case of impressing a reverse voltage.

8. The photoelectric converter apparatus as claimed in claim 7, wherein the impurity concentrations of non-vacancy layer semiconductor layers are greater than impurity concentrations of vacancy layer semiconductor layers.

9. The photoelectric converter apparatus as claimed in claim 7, wherein non-vacancy layer semiconductor layers are formed at a distance from a surface of the apparatus which is greater than the absorption length of light to enter said vacancy layer.

* * * * *